United States Patent
Wu et al.

(10) Patent No.: US 9,353,995 B2
(45) Date of Patent: May 31, 2016

(54) TEMPERATURE CONTROL MODULE FOR A SOCKET

(71) Applicant: CHROMA ATE INC., Taoyuan County (TW)

(72) Inventors: Xin-Yi Wu, Taoyuan County (TW);
Jui-Chih Chou, Taoyuan County (TW);
Hsuan-Jen Shen, Taoyuan County (TW)

(73) Assignee: CHROMA ATE INC., Taoyuan County (TW)

(*) Notice: Subject to any disclaimer, the term of this patent is extended or adjusted under 35 U.S.C. 154(b) by 37 days.

(21) Appl. No.: 14/291,573

(22) Filed: May 30, 2014

(65) Prior Publication Data
US 2014/0368999 A1  Dec. 18, 2014

(30) Foreign Application Priority Data
Jun. 18, 2013  (TW) .............................. 102121514 A

(51) Int. Cl.
*G06F 1/16* (2006.01)
*H05K 5/00* (2006.01)
*H05K 7/00* (2006.01)
*F28D 15/00* (2006.01)
*H01L 23/473* (2006.01)

(52) U.S. Cl.
CPC .............. *F28D 15/00* (2013.01); *H01L 23/473* (2013.01); *H01L 2924/0002* (2013.01)

(58) Field of Classification Search
CPC ........................................................ G06F 1/20
USPC ......... 361/689, 688, 690, 696, 705, 706, 702, 361/715, 728, 698
See application file for complete search history.

(56) References Cited

U.S. PATENT DOCUMENTS

| | | | |
|---|---|---|---|
| 5,355,942 A * | 10/1994 | Conte ................. | F28D 15/0233 165/104.33 |
| 6,404,640 B1 * | 6/2002 | Ishimine ................. | G06F 1/181 165/80.4 |
| 6,993,922 B2 | 2/2006 | Wall ............................... | 62/223 |
| 7,295,433 B2 * | 11/2007 | Taylor ................ | H05K 7/20927 174/15.1 |

(Continued)

FOREIGN PATENT DOCUMENTS

| | | |
|---|---|---|
| TW | 490567 | 6/2002 |
| TW | M270358 | 7/2005 |

(Continued)

OTHER PUBLICATIONS

Chinese Office Action 102121514, Oct. 14, 2014, TW.

(Continued)

*Primary Examiner* — Anthony Haughton
(74) *Attorney, Agent, or Firm* — Bui Garcia-Zamor; Jessica H. Bui, Esq.

(57) ABSTRACT

A temperature control module for a socket is provided with of an upper docking plate and a lower docking plate. The upper docking plate has a recess for accommodating a socket and two temperature-controlling fluid passages. One end of the passages communicates with the recess, and the other end thereof is connected to a temperature-controlling fluid source. The lower docking plate is disposed under the upper docking plate and covers the recess. A fluid chamber is formed of the recess of the docking plate, the lower docking plate and the socket. The temperature-controlling fluid source outputs a temperature-controlling fluid to the fluid chamber via the temperature-controlling fluid passages for maintaining the socket at a specific temperature.

16 Claims, 2 Drawing Sheets

(56) References Cited

U.S. PATENT DOCUMENTS

| | | | |
|---|---|---|---|
| 8,937,810 B2* | 1/2015 | Brunschwiler | H05K 7/20772 165/104.33 |
| 2002/0060581 A1 | 5/2002 | Okamoto | 324/760 |
| 2006/0050483 A1* | 3/2006 | Wilson | H01L 23/473 361/702 |
| 2011/0156734 A1 | 6/2011 | Berry et al. | 324/750.19 |
| 2014/0078672 A1* | 3/2014 | Brunschwiler | H05K 7/20772 361/699 |

FOREIGN PATENT DOCUMENTS

| | | |
|---|---|---|
| TW | 201140088 A | 11/2011 |
| TW | 201238453 A | 9/2012 |

OTHER PUBLICATIONS

Search Report 102121514, Oct. 14, 2014, TW.

* cited by examiner

TEMPERATURE CONTROL MODULE FOR A SOCKET

BACKGROUND OF THE INVENTION

1. Field of the Invention

The invention relates to a temperature control module for a socket, and particularly to a temperature control module suitable for providing test environment with different temperatures for testing electronic components.

2. Description of the Related Art

Generally speaking, after electronic components have been accomplished through a series of manufacturing processes, for most of electronic components, they have to be tested with a test instrument to ensure they can be normally operated. However, for testing of electronic components, it is a very important task to test the electronic components under high-temperature or low-temperature environment.

Under the current technical circumstances, most of high-temperature or low-temperature tests are prepared by using a temperature control device. Hence, when the temperature control device directly contacts an electronic component to be tested, it will be heated or cooled. For example, U.S. Pat. No. 6,993,922, FIG. 1 discloses a thermal head 14, comprising a cooled portion 26 and a heated portion 28. Furthermore, the thermal head 14 is connected to a rod 18 which can be lifted and lowered by a piston of a cylinder. The lifting and lowering movements make the contact surface 16 of the thermal head 14 in contact with or get away from an electronic device 10 to be tested. Accordingly, the electronic device 10 can be heated or cooled by the heated portion 28 or the cooled portion 26 respectively.

Moreover, since a test fixture 12 itself is not heated or cooled, it is heated or cooled when a formal test is progressed. That is, when the electronic device 10 is set on the test fixture 12, the thermal head 14 heats or cools the electronic device 10 to make the test fixture 12 reach the same temperature through thermal conduction.

Nevertheless, this temperature control means can only heat or cool the top portion of the electronic device to be tested, such that it is difficult to precisely and uniformly control the temperature of the test environment.

It can be seen that if a sock is provided with a module having a temperature control function, then a high-temperature or low-temperature environment can be built to test the electronic device readily. For the chip testing field, there is an urgent demand for a socket which does not need to take any waiting time to heat or cool a chip to be tested and can continuously maintain a socket at a predetermined temperature.

SUMMARY OF THE INVENTION

A main objective of the present invention is to provide a temperature control module for a socket, which can continuously maintain the socket at a high-temperature or low-temperature state in order to put a chip to be tested completely under a predetermined high-temperature or low-temperature environment. As such, a test result can be obtained more precisely. It is more important that a test can be progressed quickly, since it is unnecessary to take any waiting time to heat or cool the chip to be test.

To attain the above objective, a temperature control module for a socket according to the present invention mainly comprises an upper docking plate and a lower docking plate. The upper docking plate is provided with a recess. The recess used to accommodate a socket has a bottom surface with an opening thereon. The socket abuts the bottom surface of the recess. The opening corresponds to a chip slot of the socket. The upper docking plate further comprises at least one temperature-controlling fluid passage, one end of which communicates with the recess, and the other end of which is connected to a temperature controlling fluid source. Furthermore, the lower docking plate is disposed under the upper docking plate to cover the recess. A fluid chamber is formed among the recess of the upper docking plate, the lower docking plate and the socket. The temperature controlling fluid source feeds a temperature controlling fluid into the fluid chamber via the at least one temperature controlling fluid passage.

Accordingly, by accommodating the socket in the fluid chamber filled with the temperature controlling fluid, the socket can be heated or cooled all the time so as to maintain at a specific temperature. As in cooperation with a chip pressing mechanism having a temperature control function, located above the socket, a chip to be test is surrounded in a test environment at predetermined temperature. Therefore, on one hand the accuracy of chip test can be enhanced, and on the other hand test efficiency can be significantly promoted.

The fluid chamber of the invention can be formed by the recess of the upper docking plate, the upper surface of the lower docking plate and the surrounding sidewalls of the socket. As such, the surrounding sidewalls of the socket is in contact with the temperature controlling fluid directly to perform heat exchange for increasing or decreasing temperature. Additionally, the present invention can further comprise a gasket for sealing the upper docking plate and the lower docking plate therebetween. The gasket is opened with a through hole corresponding to the recess of the upper docking plate. Accordingly, by bring the upper docking plate and the lower docking plate to a sealing state with the gasket, the present invention can prevent the temperature controlling fluid from leaking. The gasket can be formed of high-density foam, rubber, silica gel or other equivalent sealing material with elasticity property.

Furthermore, the upper docking plate can comprise two temperature controlling fluid passages. An opening is provided on each of the two end sides of a sidewall of the recess of the upper docking plate. The two temperature controlling fluid passages communicates with the openings, respectively. Accordingly, the two temperature controlling fluid passages are for the input and output passages of the temperature controlling fluid, respectively. Moreover, the input and output openings are disposed on the two end sides of the sidewall of the recess, such that the temperature fluid can flow along the surrounding sidewalls of the socket and perform heat exchange. As a result, a better temperature control effect can be obtained.

Preferably, the lower docking plate of the present invention can be a circuit load board electrically which is matched with the socket. In other words, the circuit load board for the socket can serve as the lower docking plate, directly, and the socket is electrically connected with the circuit load board for transmitting electrical signal. Furthermore, for removing the problem that water vapor inclines to condense under a low-temperature test environment, the present invention can further comprises a dry air kit, disposed bellow the lower docking plate. The dry air kit has an outlet directed toward the lower docking plate. Accordingly, dry air can be directed toward the lower docking plate, in order to prevent the lower docking plate from being moistened and causing circuits to be out of work.

To attain the above objective, a temperature control module for a socket according to the present invention mainly comprises a carrier and a temperature controlling fluid source. In the interior of the carrier, there are a fluid chamber and at least one temperature controlling fluid passage; and, on the upper surface of the carrier, there is an opening. The opening and the at least one temperature-controlling fluid passage communicate with the fluid chamber. The fluid chamber is used to accommodate a socket, and a chip slot of the socket is exposed to the opening. Moreover, the temperature controlling fluid source is connected to the at least one temperature controlling fluid passage of the carrier. The temperature controlling fluid source provides a temperature fluid through the least one temperature controlling fluid passage. The temperature controlling fluid source inputs a temperature controlling fluid to the fluid chamber via the least one temperature controlling fluid passage in order for the temperature controlling fluid to heat or cool the socket.

It is preferable that the carrier is formed of an upper docking plate, a gasket, and a lower docking plate. The gasket is sandwiched in between the upper docking plate and the lower docking plate, which the lower docking plate can be the circuit load board of the socket.

DESCRIPTION OF THE PREFERRED EMBODIMENTS

Figure 1:
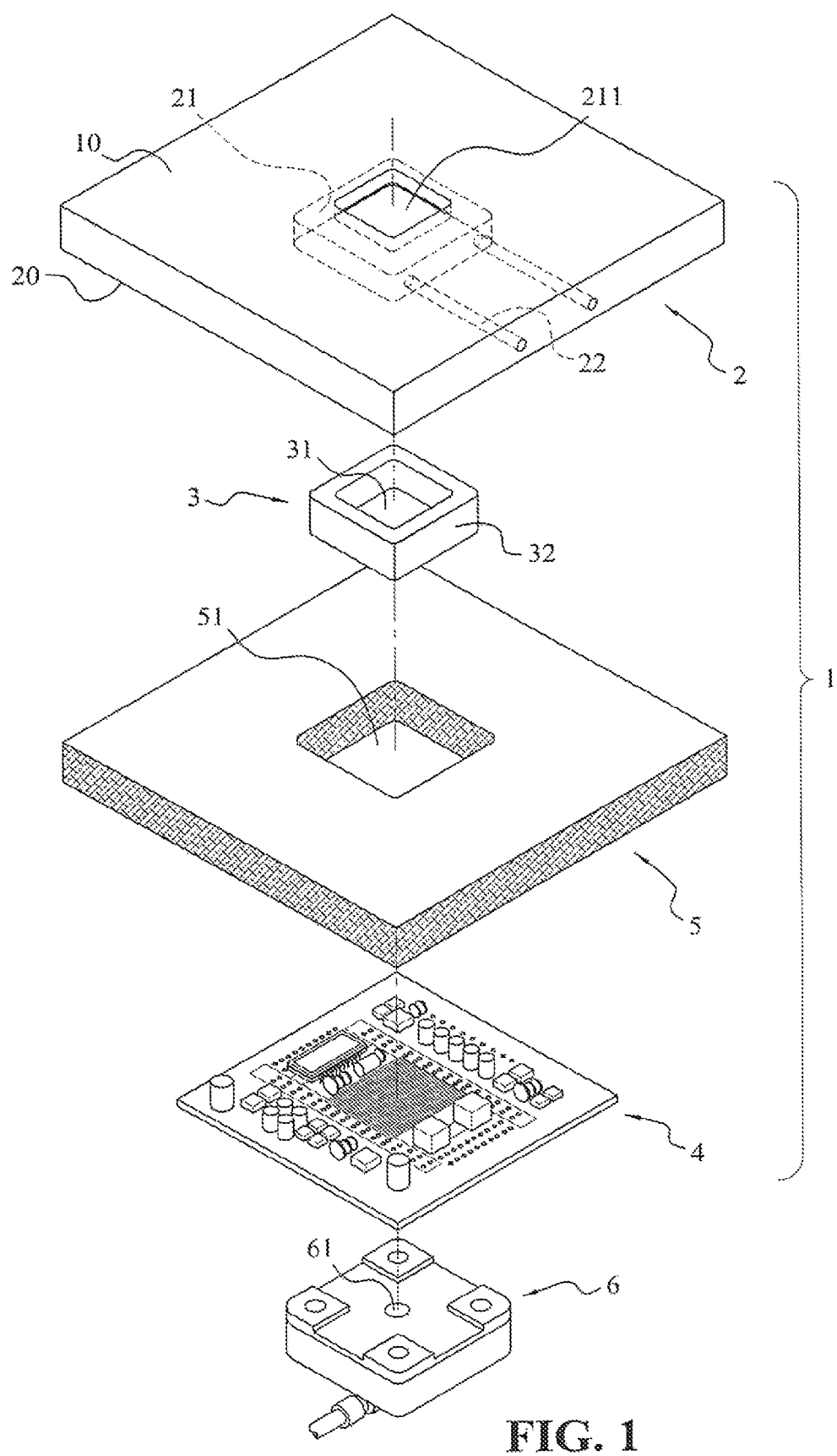
FIG. 1 is an exploded view of a preferred embodiment of the present invention.

Before describing a temperature control module for a socket of the present invention in this embodiment, it should be noted that the similar elements are designated with the same reference numeral in the following description.

A temperature control module for a socket provided in this embodiment is used to cooperate with a chip pressing mechanism (not shown in the figures of the drawings). However, it is not limited to this, and can also be used in cooperation with other components or alone, depending on actual requirements.

Figure 2:
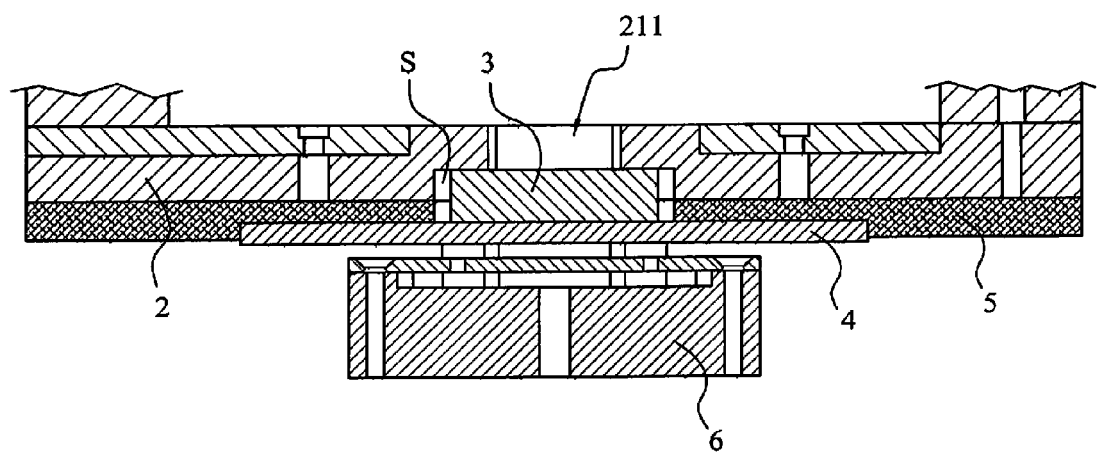
FIG. 2 is a cross-sectional view of the preferred embodiment of the present invention.

Referring to FIG. 1 and FIG. 2 at the same time, FIG. 1 is an exploded view of a preferred embodiment of a temperature control module for a socket of the present invention, and FIG. 2 is a cross-sectional view of the preferred embodiment of the temperature control module for the socket of the present invention. The embodiment mainly comprises an upper docking plate 2, a socket 3, a lower docking plate 4, a gasket 5, and a dry air kit 6. However, in other embodiments, the upper docking plate 2 and the lower docking plate 4 can be formed as a carrier 1 in one piece. The upper docking plate 2 is provided with a recess 21 for accommodating the socket 3.

Figure 3:
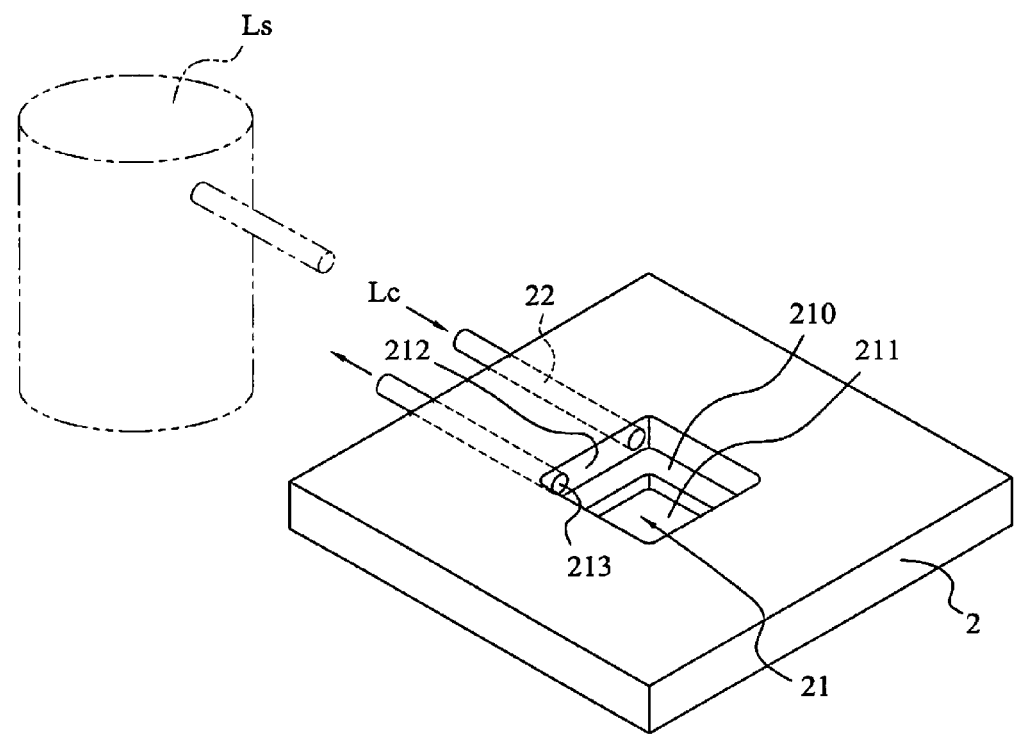
FIG. 3 is a bottom perspective view of a docking plate of the present invention.

Further referring to FIG. 3, FIG. 3 is a bottom perspective view of a preferred embodiment of the docking plate. As shown in FIG. 3, the recess 21 comprises a bottom surface 210, and the bottom surface 210 has an opening 211 at its center. The socket 3 is fastened to the bottom surface of the recess 21. Also, the opening 211 corresponds to a chip slot 31 of the socket 3. The chip slot 31 of the socket 3 is exposed to the opening 211. Into the chip slot 31, a chip to be test (not shown in the figures of the drawings) will be inserted.

Moreover, the upper docking plate 2 comprises two temperature controlling fluid passages 22. One end of each temperature controlling fluid passage 22 is connected to the recess 21, and the other end thereof is connected to a temperature controlling fluid source LS. In the present embodiment, an opening 213 is provided on each of the two end sides of a sidewall 212 of the recess 21 of the docking plate 2, and the two temperature controlling fluid passages 22 communicate with the openings 213, respectively, in which the two temperature controlling fluid passages 22 are used as an input passage and an output passage, respectively, and are arranged to the openings of the two side ends of the sidewall of the recess. As such, the temperature fluid can flow along the surrounding sidewalls of the socket 3 and perform heat exchange. As a result, a better temperature control effect can be obtained.

Furthermore, the gasket 5 is disposed under the bottom surface 20 of the upper docking plate 2 and sandwiched in between the upper docking plate 2 and the lower docking plate 4, the gasket 5 being opened with a through hole 51 which is corresponding to the recess 21 of the upper docking plate 2. In the present embodiment, the material for forming the gasket 5 is high-density foam, but it is not limited to this. Such materials as Rubber, silica gel or other equivalent sealing materials having elasticity property can be applied to the gasket 5 as well. Accordingly, the gasket 5 is mainly used to bring the upper docking plate 2 and the lower docking plate 4 into a sealing contact so as to prevent the temperature controlling fluid from leakage.

Moreover, the lower docking plate 4 is disposed under the gasket 5 to cover the recess 21 and the through hole 51. In the present embodiment, the lower docking plate 4 is a circuit load board for electrically matching with the socket 3. In other words, the circuit load board of the socket 3 can be directly served as the lower docking plate 4, the socket 3 being electrically connected with the circuit load board for transmitting electrical signal. Since the circuit load board of the socket 3 is used to serve as the lower plate 4, on the circuit load board, there are electronic elements, printed circuits or holes, which can result in leakage of the temperature controlling fluid. However, the adoption of the gasket 5 having elastic characteristic can just fill all gaps to form a sealing.

As shown in FIG. 1 and FIG. 2, the recess 21 of the upper docking plate 2, the through hold 51 of the gasket 5, the lower docking plate 4, and the surrounding sidewalls 32 of the socket 3 form a fluid chamber S. The temperature controlling fluid source LS inputs a temperature controlling fluid Lc into the fluid chamber S via one of the two temperature controlling fluid passages 22, and the temperature controlling fluid Lc in the fluid chamber S is output via the other one of the two temperature controlling fluid passages 22, thereby attaining the circulation of the temperature controlling fluid Lc. As a result, the socket 3 can be maintained at a specific temperature all the time.

Furthermore, considering the problem that water vapor easily condenses under a low-temperature test environment, the present invention is provided with the dry air kit 6.

In the present embodiment, since the circuit load board of the socket 3 (it is a printed circuit board) is adopted directly to be the lower docking plate 4, it especially needs to prevent the circuit load board from being moistened. As we know, once the circuit load board is wetted with dew, it is easy to cause short circuit to damage electronic elements and circuits. As shown in figure, the dry air kit 6 is provided on the bottom surface of the lower docking plate 4 and communicates with a dry air source (not sown). Also, the dry air kit 6 comprises an outlet 61 for directing a dry air toward the bottom surface of the lower plate 4.

For convenient description, the above embodiment is exemplified only. The scope of the present invention should be based on the following claims, and is not limited to the above embodiment.

What is claimed is:

1. A temperature control module for a socket, comprising:
   an upper docking plate comprising a recess for accommodating a socket and at least one temperature-controlling fluid passage, the recess having a bottom surface with an opening thereon, whereby the socket rests on the bottom surface of the recess with a chip slot of the socket corresponding to the opening, one end of the fluid passage communicating with the recess, and the other end of the fluid passage being connected with a temperature-controlling fluid source; and
   a lower docking plate disposed under the upper docking plate to cover the recess;
   wherein a fluid chamber is formed of the recess of the upper docking plate, the lower docking plate and the socket, and a temperature-controlling fluid is fed into the fluid chamber via the at least one temperature-controlling fluid passage from the temperature-controlling fluid source; and
   wherein the socket comprises a plurality of surrounding sidewalls, and at least the surrounding sidewalls of the socket are in direct contact with the temperature-controlling fluid for heat exchange.

2. The temperature control module according to claim 1, wherein the fluid chamber is formed by the recess of the upper docking plate, an upper surface of the lower docking plate and the surrounding sidewalls of the socket.

3. The temperature control module according to claim 1, further comprising a gasket for sealing the upper docking plate and the lower docking plate therebetween, the gasket being opened with a through hole corresponding to the recess of the upper docking plate.

4. The temperature control module according to claim 1, wherein the upper docking plate comprises two temperature-controlling fluid passages with two openings on two end sides of a sidewall of the recess of the upper docking plate, the two temperature-controlling fluid passages communicating with the two openings, respectively.

5. The temperature control module according to claim 1, wherein the lower docking plate is a circuit load board electrically matching with the socket.

6. The temperature control module according to claim 1, further comprising a dry air kit; disposed on the lower docking plate, having an outlet directed toward the lower docking plate.

7. A temperature control module for a socket, comprising:
   a carrier defining an interior of a fluid chamber and at least one temperature-controlling fluid passage therein, and having an opening on an upper surface of the carrier, the opening and the at least one temperature-controlling fluid passage communicating with the fluid chamber, and the fluid chamber accommodating a socket with a chip slot of the socket exposed to the opening; and
   a temperature-controlling fluid source connected to the at least one temperature-controlling fluid passage, to feed a temperature-controlling fluid via the at least one temperature-controlling fluid passage;
   wherein the temperature-controlling fluid is fed into the fluid chamber via the at least one temperature-controlling fluid passage from the temperature-controlling fluid source in order to heat or cool the socket; and
   wherein the socket comprises a plurality of surrounding sidewalls, and at least the surrounding sidewalls of the socket are in direct contact with the temperature-controlling fluid for heat exchange.

8. The temperature control module according to claim 7, wherein the carrier is formed by joining an upper docking plate with a lower docking plate.

9. The temperature control module according to claim 8, further comprising a gasket for sealing the upper docking plate and the lower docking plate therebetween, the gasket being opened with a through hole corresponding to the recess of the upper docking plate.

10. The temperature control module according to claim 9, wherein the lower docking plate is a circuit load board electrically matching with the socket.

11. A temperature control module for a socket, comprising:
    a temperature controlling fluid source; and
    a carrier comprised of a lower docketing plate, an upper docketing plate, and a gasket sandwiched between the upper docketing plate and the lower docketing plate,
    wherein the upper docketing plate is provided with a recess to accommodate a socket and at least one temperature-controlling fluid passage, the recess having a bottom surface with an opening where the socket rests on the bottom surface of the recess with a chip slot of the socket corresponding to the opening;
    wherein the lower docking plate is disposed below the upper docking plate to cover the recess;
    wherein a fluid chamber is formed of the recess of the upper docking plate, the lower docking plate and the socket, and a temperature-controlling fluid is fed into the fluid chamber via the at least one temperature-controlling fluid passage from the temperature-controlling fluid source; and
    wherein the socket comprises a plurality of surrounding sidewalls, and at least the surrounding sidewalls of the socket are in direct contact with the temperature-controlling fluid for heat exchange.

12. The temperature control module according to claim 11, wherein the fluid chamber is formed by the recess of the upper docking plate, an upper surface of the lower docking plate and the surrounding sidewalls of the socket.

13. The temperature control module according to claim 11, further comprising a gasket for sealing the upper docking plate and the lower docking plate therebetween, the gasket being opened with a through hole corresponding to the recess of the upper docking plate.

14. The temperature control module according to claim 11, wherein the upper docking plate is provided with two temperature-controlling fluid passages with two openings on two end sides of a sidewall of the recess of the upper docking plate, the two temperature-controlling fluid passages communicating with the two openings, respectively.

15. The temperature control module according to claim 11, wherein the lower docking plate is a circuit load board electrically matching with the socket.

16. The temperature control module according to claim 11, further comprising a dry air kit disposed on the lower docking plate, having an outlet directed toward the lower docking plate.

* * * * *